(12) United States Patent
Narasimalu et al.

(10) Patent No.: US 7,544,539 B2
(45) Date of Patent: Jun. 9, 2009

(54) FORCED HEAT TRANSFER APPARATUS FOR HEATING STACKED DICE

(75) Inventors: Srikanth Narasimalu, Singapore (SG); Sathish Kumar Balakrishnan, Singapore (SG); Lin Ji, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 0 days.

(21) Appl. No.: 11/321,823

(22) Filed: Dec. 29, 2005

(65) Prior Publication Data

US 2007/0152324 A1 Jul. 5, 2007

(51) Int. Cl.
*H01L 21/44* (2006.01)

(52) U.S. Cl. .................. 438/107; 438/109; 438/118; 257/E23.02; 257/E23.099

(58) Field of Classification Search ................ 438/107, 438/109, 118, 612, 613, 614, 617
See application file for complete search history.

(56) References Cited

U.S. PATENT DOCUMENTS

| 6,444,943 | B2 * | 9/2002 | Barnett | 219/121.46 |
| 6,500,760 | B1 * | 12/2002 | Peterson et al. | 438/684 |
| 2006/0254712 | A1 * | 11/2006 | Soliz et al. | 156/307.3 |
| 2007/0010083 | A1 * | 1/2007 | Aoh et al. | 438/612 |

* cited by examiner

*Primary Examiner*—Hsien-ming Lee
(74) *Attorney, Agent, or Firm*—Ostrolenk, Faber, Gerb & Soffen, LLP

(57) ABSTRACT

An apparatus and method are provided for effectively heating a first die stacked above a second die attached onto a substrate during wire bonding conducted on the first die. A gas outlet positionable adjacent to the first die is configured to project a hot gas onto bond pads of the first die for bringing the bond pads to a desired bonding temperature, thereby rapidly heating the first die for effective wire bonding.

16 Claims, 6 Drawing Sheets

FORCED HEAT TRANSFER APPARATUS FOR HEATING STACKED DICE

FIELD OF THE INVENTION

The invention generally relates to the processing of semiconductor devices, and in particular, to a method and apparatus for effective heating of a semiconductor die, especially a die comprised in stacked dice, during bonding of wires to the semiconductor die.

BACKGROUND AND PRIOR ART

Wire bonding is one of the key manufacturing processes in electronic packaging in which a die comprising integrated circuits, is electrically connected to a substrate to which it has been attached by fine wires of conductive material, such as aluminum, copper or gold wires.

A vast majority of wire-bonded interconnections are made with thermosonic bonding. Thermosonic bonding is a combination of ultrasonic and thermocompression welding that optimizes the best qualities of each for microelectronic usage. Thermocompression welding per se usually requires interfacial temperatures of at least 300° C. Such temperatures may damage some die-attach plastics, packaging materials, laminates, as well as some heat-sensitive dice.

However, utilizing thermosonic bonding, the interface temperature can be much lower, typically between 125° C. and 220° C., which avoids such problems with heat damage. The ultrasonic energy helps disburse contaminants during the early part of the bonding cycle and the thermal energy helps to mature the weld through diffusion of energy to promote metallic diffusion and hence intermetallic growth at the interface of the bond sites. This combination of ultrasonic and thermocompression welding also allows the ultrasonic energy to be kept small enough to minimize cratering damage to the semiconductor die. Thus, the connectivity and strength of the thermosonic bonds substantially depend on thermal diffusivity of energy from a heating source to the bond sites, and hence the effectiveness of thermal transfer to the bond sites is important.

In conventional electronic devices, a substrate is usually attached with a single die to which thermal energy can be directly transferred from a heating source underneath the substrate to a bond site on the die by conduction. As the combined thickness of the single die and substrate is relatively thin, the rate of thermal diffusion through the substrate and then through the die is quite fast.

However, with improvement in technology, there are now semiconductor devices wherein a die is attached onto another die to increase functionality of the device. The die that is stacked on top of another die may overhang from the bottom die, and the overhang may be more than a few millimeters. Furthermore, a substrate may be mounted with multiple layers of dice. FIG. 1 is an illustration of a multi-layer stacked dice assembly 10 of the prior art. The multi-layer stacked dice assembly 10 comprises a plurality of individual dice 12 orthogonally arranged with respect to one another and mounted on top of a substrate 14. The stacked dice 12 are electrically connected to the substrate 14 by a plurality of bonded wires 16.

It will be convenient to hereinafter illustrate the thermal diffusivity within the multi-layer stacked dice assembly 10 by reference to a single die stacked onto a second die on a substrate, whereby thermal diffusion through multiple layers of stacked dice can be demonstrated.

FIG. 2 is an isometric view of a stacked dice assembly 20 being heated with a conventional heat transfer system of the prior art. The stacked dice assembly 20 comprises a first die 22 mounted on a second die 24, which is in turn mounted on a substrate 26. Layers of adhesive 28 are disposed between the first die 22 and the second die 24, and between the second die 24 and the substrate 26 respectively. The first die 22 comprises a plurality of bond pads 30 on its top surface. The stacked dice assembly 20 in FIG. 2 is shown partly bonded with bonding wires 32 interconnecting the bond pads 30 to leads 34 on the substrate 26.

A heating source 36, such as a hot plate, is introduced beneath the substrate 26 for providing thermal energy during the thermosonic bonding process. As the thermal energy is received by the substrate 26, it is diffused upwards from the substrate 26 through the first layer of adhesive 28 to the second die 24, and then through another layer of adhesive 28 to the first die 22, and eventually to the bond pads 30 on the first die 22.

Thermal diffusion is omni-directional and thermal energy diffuses from points of higher temperature towards the boundaries of components where the temperatures are lower. Due to such temperature differences, thermal energy transfer by conduction occurs within components of the stacked dice assembly 20. Internal arrows 38 indicate the flow of thermal energy conducted through the components.

However, in normal operating environments, the stacked dice assembly 20 is surrounded by ambient air of lower temperature. The thermal energy is able to diffuse into and be lost through the ambient air. Besides this, there is also energy being lost by advection through the bulk motion of air. Air flow is induced by buoyancy forces which arise from density differences caused by temperature variation in the air near the surfaces of the stacked dice assembly 20 and the ambient atmosphere. This causes natural convection heat lost to the environment. In FIG. 2, external arrows 40 indicate the natural convection heat lost to the environment.

Such convection heat loss occurs over the surfaces of the stacked dice assembly 20. The amount of heat lost through natural convection therefore increases when larger surface areas are exposed to the atmosphere. An overhanging die, and especially multiple layers of overhanging stacked dice 12 packed in the manner shown in FIG. 1, have large surface areas exposed to the ambient atmosphere. Thus, stacked dice are more susceptible to natural convection heat loss than single dice.

Moreover, the orthogonal arrangements of adjacent dice 12 in the stacked dice assembly 10 reduce the die-to-die contact surfaces needed for thermal diffusion through the components. Therefore, the thermal diffusivity of the stacked dice assembly 10 through conduction is adversely affected.

In addition, the semiconductor dice, which are made of silicon, are inherently poor thermal conductors and have high thermal resistance. The thermal resistance effect is further compounded by the layers of adhesive disposed at the interfaces between the die and substrate, and the interfaces between adjacent dice respectively. The adhesives usually comprise polymeric materials, which are inherently poor thermal conductors and have high thermal resistance. Hence, the inherent material properties of the multi-layered silicon dice and the polymeric adhesive detrimentally affect the thermal diffusivity of the stacked dice assembly 10.

In cases where die bending needs to be minimized, and/or when a higher loop height for the bottom die is required, thicker dice are used in the stacked dice assembly. An increase in the thickness of a die, however, will substantially increase its thermal resistance, and hence decrease its thermal diffusivity. Similarly, the thicker the adhesive between the dice, the lower is the thermal diffusivity of the stacked dice assembly 10.

Furthermore, the rate of heat loss depends on the temperature differences between the stacked dice assembly 10 and the ambient atmosphere. A temperature gradient between the stacked dice assembly 10 and the ambient atmosphere will generally vary according to environmental temperature changes. Therefore, the temperature on the bond pads of the stacked dice assembly 10 is unpredictable when the environmental temperature changes, causing difficulty in controlling the temperature at the bond pads.

As such, the conventional heat transfer system is unable to consistently provide a constant bonding temperature to the bond pads 30, thereby reducing the effectiveness of the thermosonic bonding being performed. The connectivity and strength of the bonds may be affected.

Accordingly, it would be desirable to alleviate the aforesaid disadvantages of the prior art by providing a simple and cost effective apparatus for transferring thermal energy efficiently to the stacked dice during wire bonding in order to achieve a consistent bonding temperature at the bond pads 30.

SUMMARY OF THE INVENTION

It is thus an object of the invention to seek to provide an apparatus for effective heating of a die comprised in a stacked dice assembly during wire bonding by incorporating a forced convection heat transfer system such that the aforesaid problems with relying solely on heat conduction may be reduced.

According to a first aspect of the invention, there is provided a heat transfer apparatus for heating a first die that is stacked above a second die attached onto a substrate during wire bonding conducted on the first die, the apparatus comprising a gas outlet positionable adjacent to the first die that is configured to project a hot gas onto bond pads of the first die for bringing the bond pads to a desired bonding temperature.

According to a second aspect of the invention, there is provided an apparatus for conducting wire bonding on a first die that is stacked above a second die attached onto a substrate, the apparatus comprising: a gas outlet positionable adjacent to the first die that is configured to project a hot gas onto bond pads of the first die for bringing the bond pads to a desired bonding temperature; and a wire bonding tool for attaching wires to the bond pads of the first die when the bond pads reach the desired bonding temperature.

According to a third aspect of the invention, there is provided a method for heating a first die that is stacked above a second die attached onto a substrate during wire bonding conducted on the first die, the method comprising the step of positioning a gas outlet adjacent to the first die to project a hot gas onto bond pads of the first die for bringing the bond pads to a desired bonding temperature.

According to a fourth aspect of the invention, there is provided a method for conducting wire bonding on a first die that is stacked above a second die attached onto a substrate, comprising the steps of: positioning a gas outlet adjacent to the first die to project a hot gas onto bond pads of the first die for bringing the bond pads to a desired bonding temperature; and attaching wires to the bond pads of the first die with a wire bonding tool when the bond pads reach the desired bonding temperature.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of apparatus and methods for heating a die comprised in a stacked dice assembly during wire bonding in accordance with the invention will now be described with reference to the accompanying drawings, in which.

DETAILED DESCRIPTION OF THE PREFERRED EMBODIMENT

Figure 3:
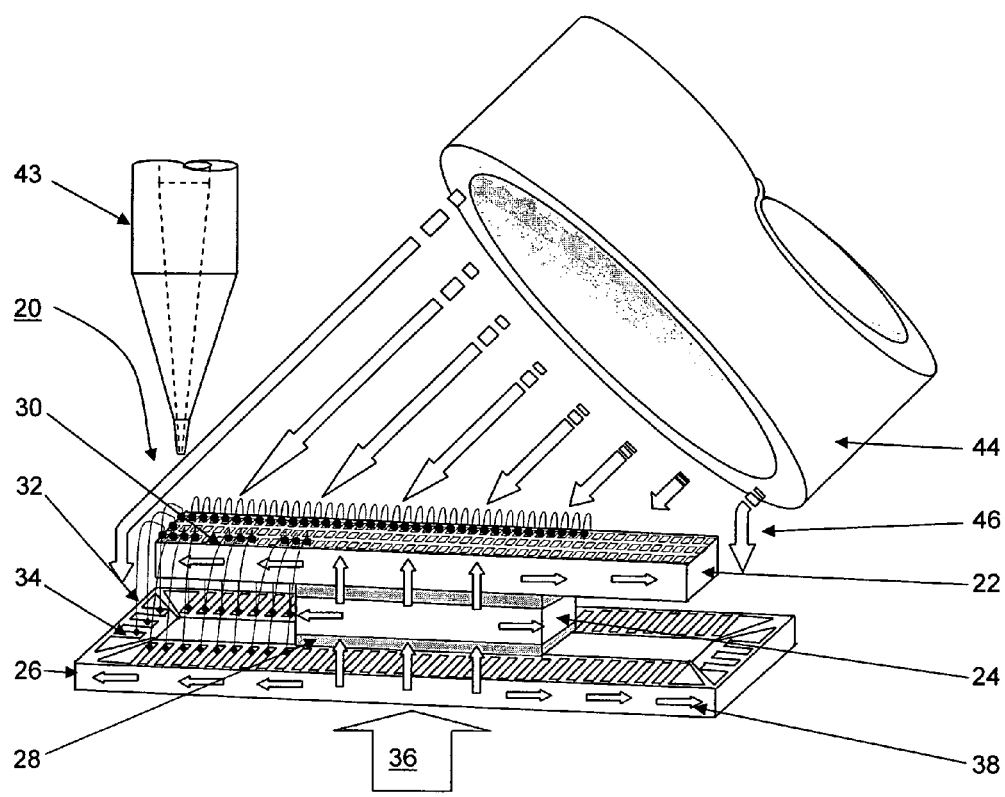
FIG. 3 is an isometric view of the stacked dice assembly being heated with a heat transfer apparatus according to the preferred embodiment of the invention.

Referring to the drawings in which like parts are referred to by like numerals, FIG. 3 is an isometric view of the stacked dice assembly 20 being heated with a heat transfer apparatus according to the preferred embodiment of the invention. The stacked dice assembly 20 comprises a first die 22, in the form of a top die, stacked above a second die 24, in the form of a buffer die. The second die 24 is bonded onto a substrate 26. The stacked dice assembly 20 may further include one or more intermediate dice between the first and second dice 22, 24.

A heating source 36 of the heat transfer apparatus, such as a platform comprising heating elements, may be located beneath the substrate 26 for supporting the substrate 26 and providing the stacked dice assembly 20 with thermal energy from the base of the substrate 26 during wire bonding. The platform preferably comprises a hot plate. Heat is thus provided to the stacked dice via the second die 24. The internal arrows 38, which indicate the flow of thermal energy diffused through the components of the stacked dice assembly 20, show a conduction heat transfer process. However, as discussed in the prior art, this mode of heating alone is susceptible to less efficient thermal energy transfer to the bond site because of factors such as natural convection heat loss.

In the preferred embodiment of the invention, a forced heating gas outlet is introduced as a primary heating source for providing thermal energy to the stacked dice assembly 20. The gas outlet is preferably in the form of a nozzle 44 that is positionable adjacent to the first die 22 at the top of the stack.

When in operation, the nozzle 44 is configured to project a stream of hot gas 46 onto the bond pads 30 of the first die 22 for bringing the bond pads to a desired bonding temperature. The nozzle 44 is further configured to create an envelope of hot gas 46 surrounding the stacked dice assembly 20, and in particular, over the bond pad 30 where wire bonding is conducted. The envelope of hot gas 46 therefore isolates the stacked dice 20 from the environmental temperature influences, thereby minimizing natural convection heat loss.

Simultaneously, the stream of hot gas 46 channeled over the bond pads 30 will help to transfer thermal energy to the bond pads 30 both by the bulk motion of the hot gas 46 as well as by thermal diffusion near the surface of the bond pads 30. Thus, this mode of energy transfer is known as forced convection heat transfer.

It is desirable that the hot gas 46 has a temperature that is the same as or higher than the desired bonding temperature of the wire bonding process. Assuming that a desired bonding temperature is 180° C., the gas temperature may be about 200° C. However, it should be borne in mind that if the targeted temperature reaches a glass transition temperature of the die-attach adhesive 28, the adhesive 28 will soften and the adhesive stiffness and strength will be substantially reduced. Therefore, the targeted temperature is preferably less than 300° C.

The stream of hot gas 46 preferably comprises an inert gas, such as nitrogen gas. Although hot air is equally good in terms of heating efficiency, nitrogen gas is preferred as it is able to protect the bond pads 30, the leads 34 and the bonding wires 32 from oxidation. The hot gas 46 is preferably free of moisture and contamination because the substrate 26 and the adhesive 28, which is usually made of polymeric material, will tend to absorb moisture especially in a high temperature environment.

It is preferable for the nozzle 44 to be adjustably attached to a bonding apparatus, which may include a capillary 43 for bonding wires to the bond pads 30. This is so that when the bonding apparatus relocates to bond wires onto other targeted bond pads 30, the nozzle 44 will also move correspondingly with the wire bonding apparatus and channel the hot gas 46 to the targeted bond pads 30.

Figure 4:
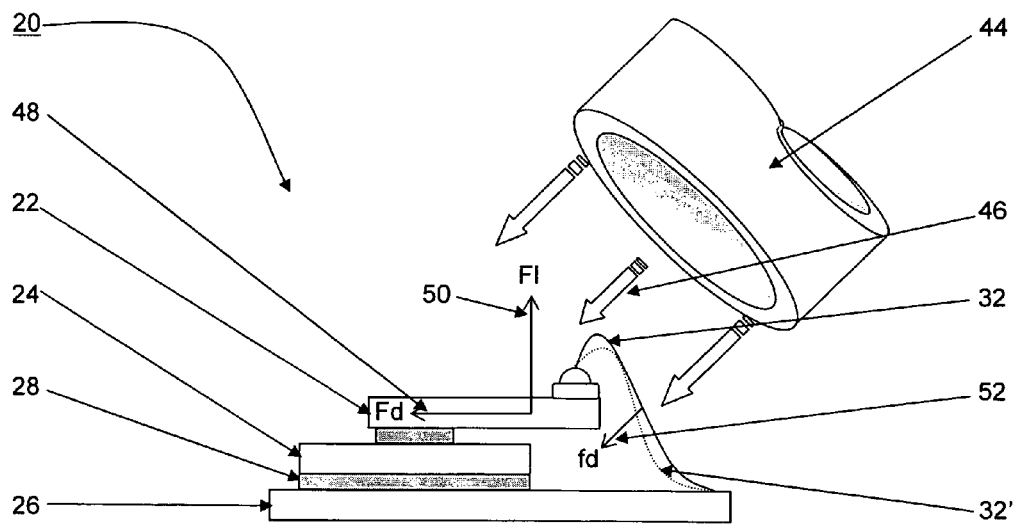
FIG. 4 is a schematic side view of a stacked dice assembly being heated as in FIG. 3.

FIG. 4 is a schematic side view of a stacked dice assembly 20 being heated as in FIG. 3. When the nozzle 44 projects the hot gas 46 over the stacked dice assembly 20, the first die 22 will experience a drag force (Fd) 48 due to the flow of viscous gas over the surface of the first die 22. The drag force (Fd) 48 increases with the surface area of the first die 22 and when it overcomes the adhesion force between the first die 22 and the second die 24, the first die 22 will shear from the second die 24.

Moreover, the first die 22 will also experience a lift force (Fl) 50 due to the gas flow direction. The lift force (Fl) 50 increases as the flow angle is decreased with respect to the plane of the first die 22. When it overcomes the adhesion force between the first die 22 and the second die 24, the first die 22 will peel from the second die 24.

In order to prevent the above mechanical failures, the hot gas 46 preferably does not contact the adhesive 28 directly. This minimizes the risk of adhesive strength reduction due to elevated temperatures that may cause the first die 22 to detach from the second die 24. Thus, the nozzle 44 of the heat transfer apparatus is preferably arranged to project hot gas 46 at an angle of 45° to 90° with respect to a plane of the first die 22 so as to avoid causing damage to the adhesive 28.

Accordingly, when the nozzle 44 projects the hot gas 46 over a partially wire-bonded stacked dice assembly 20 during the wire bonding process, the bonded wires 32 will experience a drag force (fd) 52. The drag force (fd) 52 increases with the wire length, and when the drag force (fd) 52 is too high, the bonded wires 32 will sway to position 32' in FIG. 4. When the bonded wires 32 are upset, it may cause short circuiting of the integrated circuits, or even wire breakages resulting in circuit failure.

The flow characteristic of the hot gas 46 is such that when gas 46 of density ρ, flows over a bonded wire 32 with projected area A and a drag coefficient of Cd, at a flow velocity of u, the bonded wires 32 will experience a drag force, F, as such:

$$F=0.5*Cd*\rho*u^2*A$$

Figure 5:
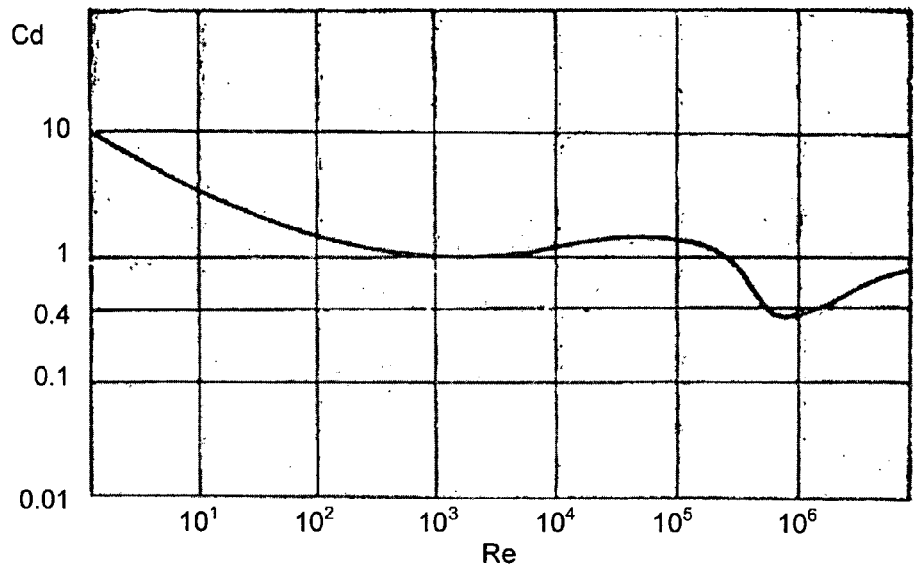
FIG. 5 is a graph showing the relationship between a drag coefficient, Cd, and a Reynolds number, Re, that is applicable to fluid flow across the surface of a smooth wire with a round cross-section.

The drag coefficient, Cd, is a function of a Reynolds number, Re, which is a dimensionless grouping of variables for determining a transition location whereat flow separation occurs, that is, where fluid flow transitions from a smooth streamline laminar boundary layer to a turbulent boundary layer. FIG. 5 is a graph showing the relationship between the drag coefficient, Cd, and the Reynolds number, Re, that is applicable to fluid flow across the surface of a smooth wire with a round cross-section. The value of Re is determined by the following equation;

$$Re=\rho*u*L/\mu$$

where ρ is the flow density of the fluid,
μ is the flow velocity of the fluid,
L is a characteristic length of flow,
μ is the viscosity of flow.

Thus, for a hot gas 46 with density 1.138 kg/m$^3$ and viscosity 1.663×10$^{-5}$ kg/ms, flowing over a bonded wire 32 of 1 mil diameter at a velocity of up to 100 m/s, the range of Re will be between 0 and 200, which corresponds to Cd having a value between 1 and 10. In this Re range, the flow conditions are dominated by friction drag. Conversely, flow separation due to turbulence is negligible. Hence, thermal energy diffusing from the gas 46 to the bonded wires 32 will not be affected by flow separation.

As such, the angle at which the hot gas 46 projects onto the fine bonded wires 32 is important, especially for long wires and high loop shapes. In order to illustrate the effects of different projection angles of hot gas 46 on the first die 22, a shower of hot gas 46 is projected onto the stacked dice assembly 20.

Figure 6A:
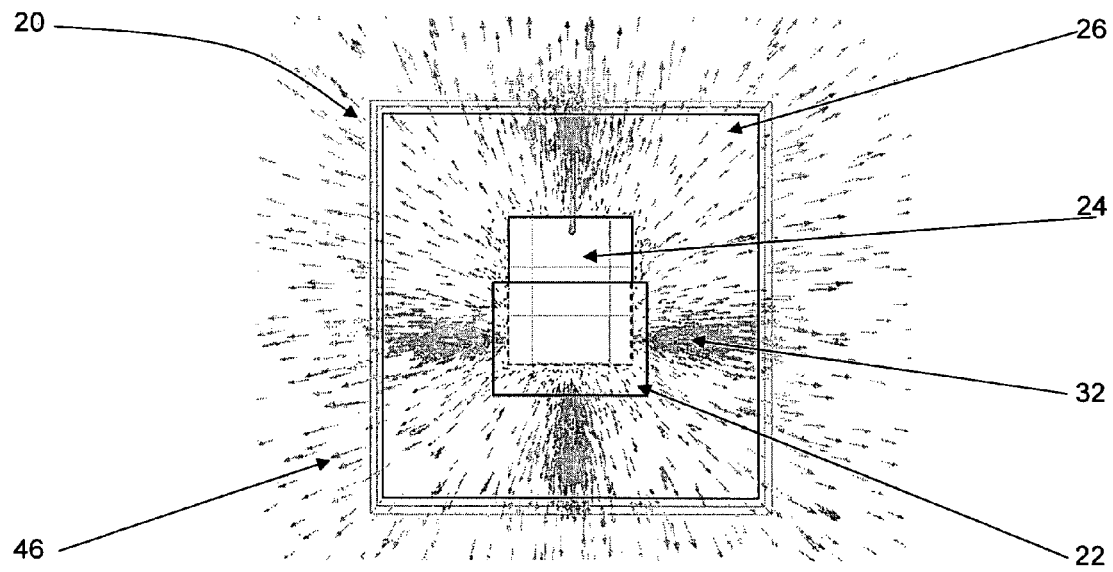
FIGS. 6A and 6B are an elevation view and a front view respectively showing the flow of hot gas that is being projected onto a stacked dice assembly from above the stacked dice assembly.
Figure 6B:
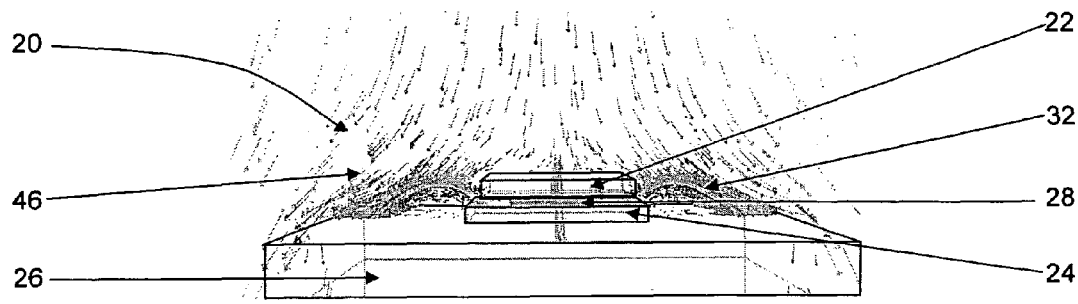

FIGS. 6A and 6B are an elevation view and a front view respectively showing the flow of hot gas 46 that is being projected onto a stacked dice assembly 20 from above the stacked dice assembly 20. The hot gas 46 is projected vertically downwards normally to the plane of the first die 22. As it flows nearer to the surface of the first die 22, the gas flows streamline along the bonded wires 32 and are aligned parallel to the bonded wires 32.

Therefore, the drag force (fd) 52 on the bonded wire 32 is minimized and hence reduces wire sway problems. This study shows that for a bonded wire 32 with diameter 1 mil and a wire length of 5 mm, the maximum allowable velocity of the gas flow would be 56 m/s. However, the velocity of gas flow is more preferably between 5 m/s and 10 m/s, and it is preferably projected normally to the plane of the first die 22 for normal operating conditions.

Figure 7:
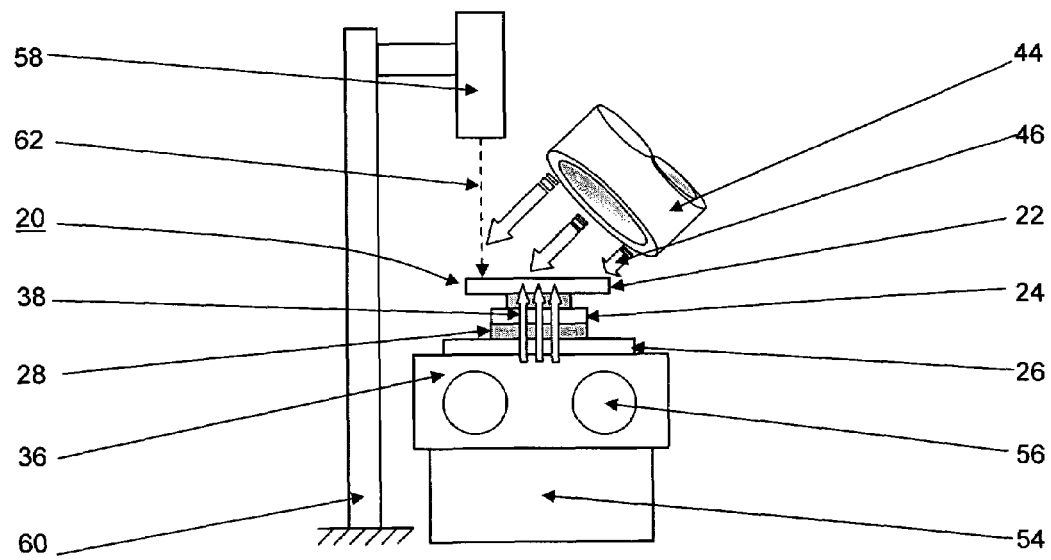
FIG. 7 is a schematic view of an experimental setup for measuring the thermal characteristic of a stacked dice assembly being heated with the heat transfer apparatus according to the preferred embodiment of the invention.

FIG. 7 is a schematic view of an experimental setup for measuring the thermal characteristic of a stacked dice assembly 20 being heated with the heat transfer apparatus according to the preferred embodiment of the invention. In the experimental setup, a heating source 36 comprising a hot plate is incorporated with heating elements in the form of heaters 56 for heating and maintaining the hot plate temperature at 200° C. This heating source provides the stacked die assembly 20 with thermal energy from beneath the substrate 26. Thus, conduction heat transfer occurs within the stacked dice assembly 20.

A nozzle 44 according to the preferred embodiment of the invention is positioned adjacent to the stacked dice assembly 20. The nozzle 44 is used to project a stream of hot nitrogen gas 46 of about 200° C. at a rate of 5-10 m/s onto the stacked dice assembly 20. Thus, forced convection heat transfer occurs on the surfaces of the stacked dice assembly 20.

An infrared temperature sensor 58 is used for capturing data regarding the thermal characteristics of the first die 22 of the stacked dice assembly 20 when it is placed under the heat transfer system of the prior art, as compared with data regarding the thermal characteristics captured when the stacked dice assembly 20 is placed under the heat transfer apparatus according to the preferred embodiment of the invention.

Figure 1:
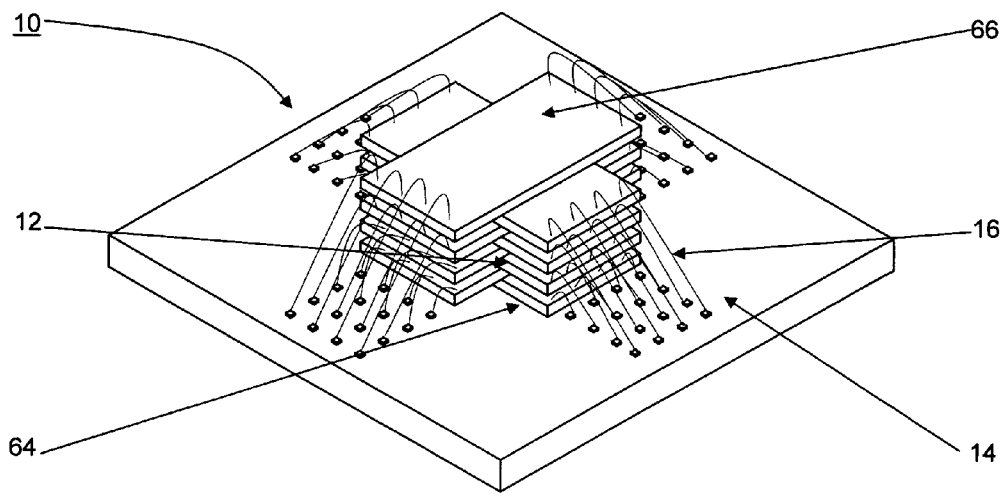
FIG. 1 is an illustration of a multi-layer stacked dice assembly of the prior art.
Figure 2:
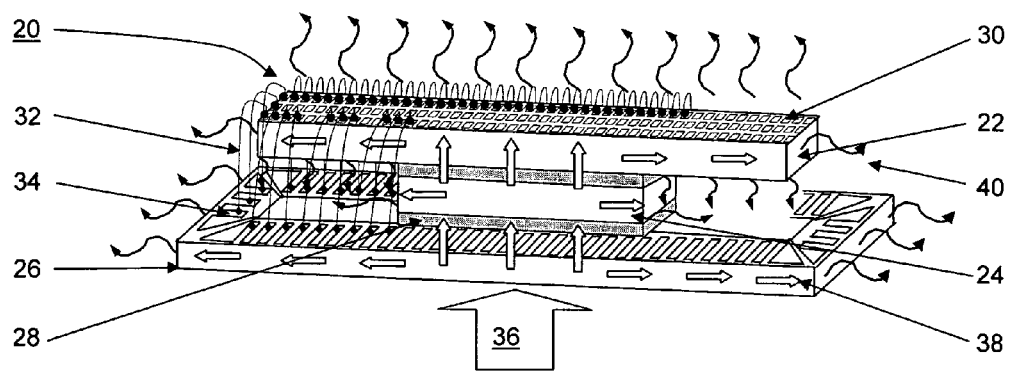
FIG. 2 is an isometric view of a stacked dice assembly being heated with a conventional heat transfer system of the prior art.

Referring to FIG. 1, a stacked dice assembly 10 comprising eight layers of stacked dice 12 is heated, and of particular interest are the thermal behaviors of a bottom-most die 64 and a top-most die 66 on the stacked dice assembly 10. The bottom-most die 64 is a die at the lowest layer of the stacked dice 12 which is adhesively attached to the substrate 14. The top-most die 66 is on the highest layer of the stacked dice 12.

The bottom-most die 64 is the first to be attached to the substrate 14 prior to wire bonding. It is then heated and wire bonding is performed. Subsequently, another die is attached to the bottom-most die 64 and wires are bonded to that die, and then subsequent dice are attached and wires are bonded to them and so on.

Figure 8A:
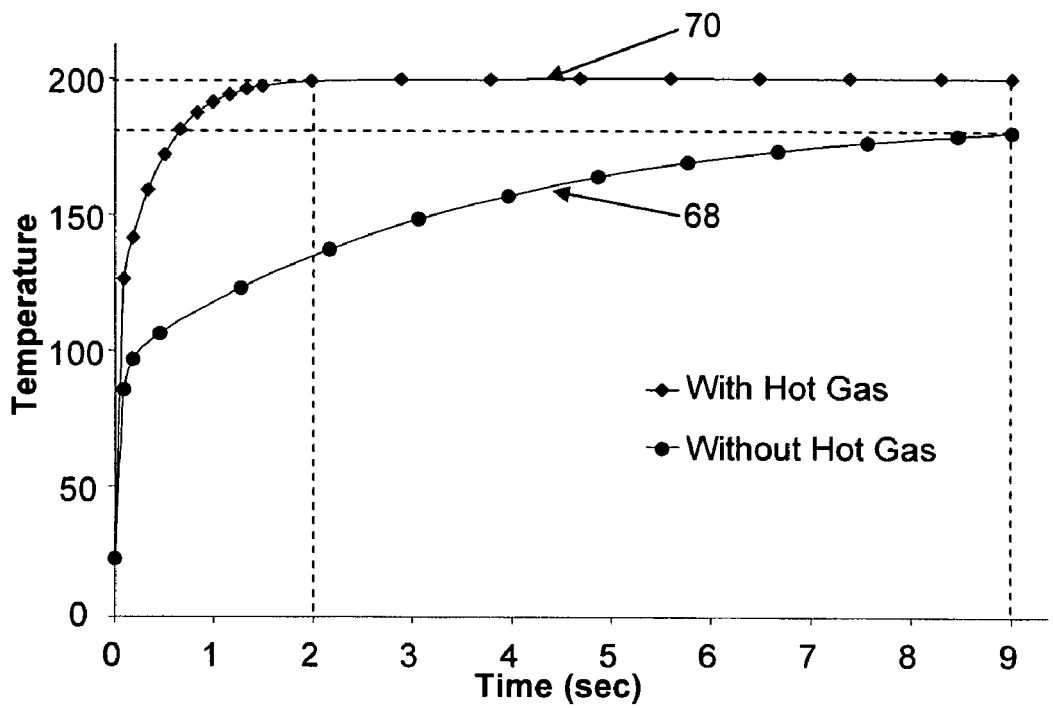
FIG. 8A is a graph showing the thermal characteristics of the bottom-most die of the stacked dice assembly being heated with a prior art heat transfer system and a heat transfer apparatus according to the preferred embodiment of the invention respectively.

When the bottom-most die 64 is attached for wire bonding, no other die is stacked on top of it. FIG. 8A is a graph showing the thermal characteristics of the bottom-most die 64 of the stacked dice assembly 10 being heated with a prior art heat transfer system and a heat transfer apparatus according to the preferred embodiment of the invention respectively. Experimental data shows that when the bottom-most die 64 is heated with the heat transfer apparatus of the preferred embodiment of the invention, the temperature 70 on the top surface rises to a targeted temperature of about 200° C. within two seconds and thereafter maintains a relatively constant temperature. On the other hand when it is heated with the prior art heat transfer system, the temperature 68 could not reach the targeted temperature even after 9 seconds.

Figure 8B:
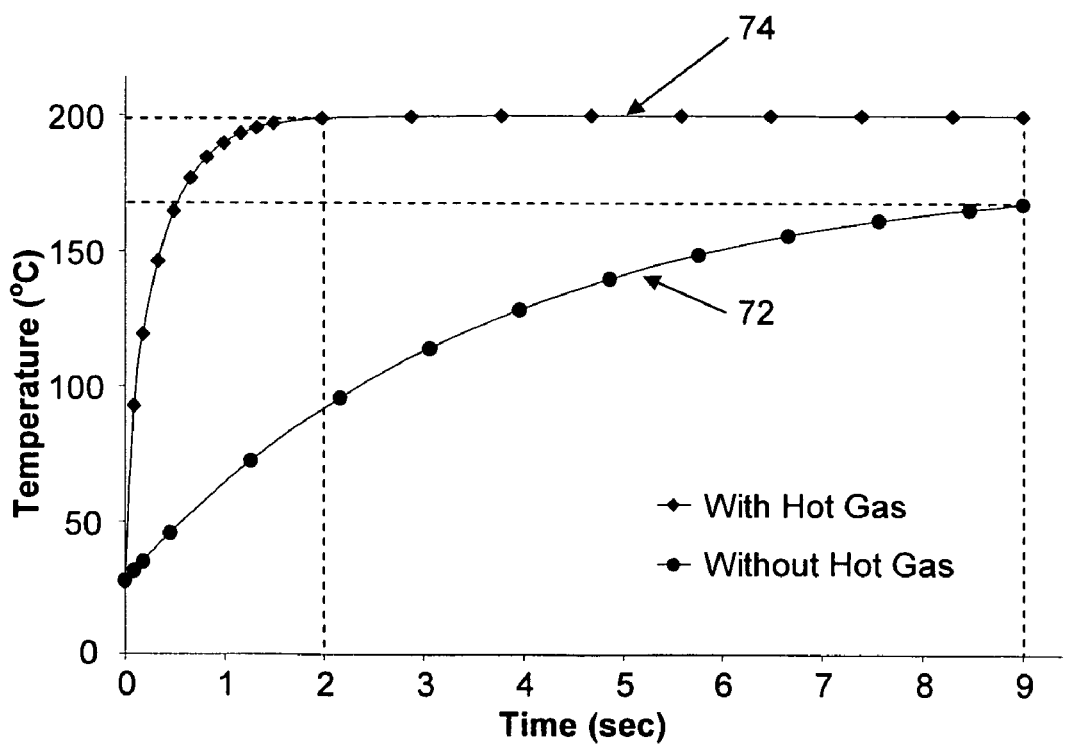
FIG. 8B is a graph showing the thermal characteristics of the top-most die of the stacked dice assembly being heated with a prior art heat transfer system and a heat transfer apparatus according to the preferred embodiment of the invention respectively.

The top-most die 66 is stacked over seven layers of dice below it when wire bonding is performed on it. FIG. 8B is a graph showing the thermal characteristics of the top-most die 66 of the stacked dice assembly 10 being heated with a prior art heat transfer system and a heat transfer apparatus according to the preferred embodiment of the invention respectively. Experimental data shows that when the top-most die 66 is heated with a heat transfer apparatus according to the preferred embodiment of the invention, the temperature 74 of the top-most die 66 rises to a targeted temperature of about 200° C. within two seconds and maintains at the steady state temperature. On the other hand when it is heated with the prior art heat transfer system, the temperature 72 could not reach the targeted temperature even after 9 seconds.

Figure 9:
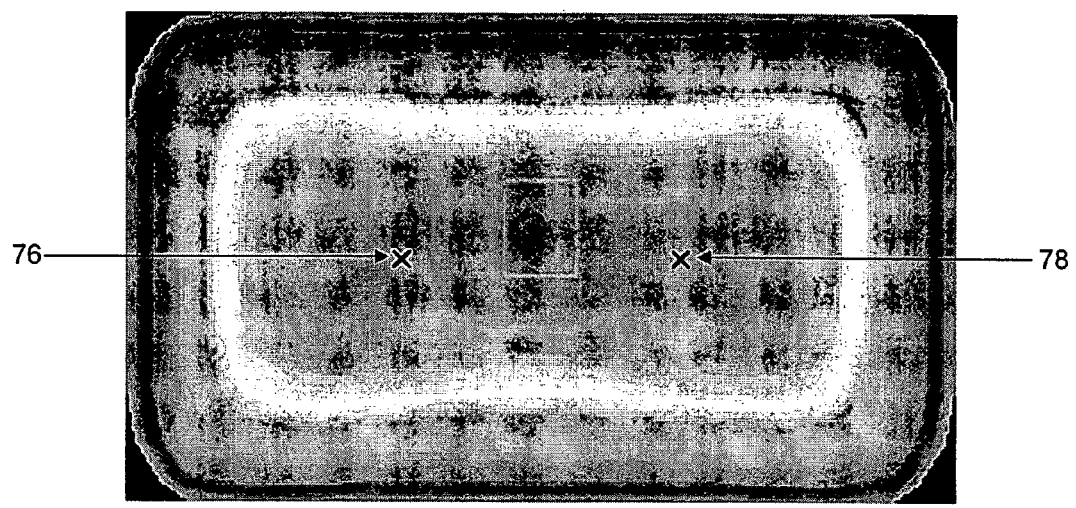
FIG. 9 is a picture showing a thermal profile of the stacked dice assembly being heated with the heat transfer apparatus according to the preferred embodiment of the invention.

FIG. 9 is a picture showing a thermal profile of the stacked dice assembly 10 being heated with the heat transfer apparatus according to the preferred embodiment of the invention. The temperature profile shows that two adjacent points, 76 and 78, on the top surface of top-most die of the stacked dice assembly 10 have temperatures of 213.1° C. and 215.9° C. respectively after the dice have been heated for about 9 seconds. Thus, a highly consistent temperature profile is obtainable over the bond pads of the top-most die of the stacked dice assembly 10.

Hence, by incorporating the heat transfer apparatus according to the preferred embodiment of the invention, a consistent targeted temperature over the bond pads of the top-most die of the stacked dice assembly is achievable. The bottom-most die and the top-most die will rapidly reach a consistent target temperature when heated by hot gas that is applied through the nozzle of the heat transfer apparatus. The heat transfer apparatus thereby helps to assure consistency in thermosonic bond connectivity and strength at different layers of the stacked dice assembly. Thus, the heat transfer apparatus improves the quality and the productivity of wire bonding machines.

Moreover, by incorporating the heat transfer apparatus, the stacked dice assembly is able to reach its targeted temperature in a relatively shorter time and then a constant target temperature is maintainable thereafter. The heat transfer apparatus therefore is able to provide a faster temperature increase to the bond pads than that of the prior art. Hence, this reduces the bonding cycle time. Thus, the preferred embodiment of the invention will increase the productivity, in the form of yield units per hour (UPH), of the wire bonding machines.

In addition, when heated with the heat transfer apparatus, the stacked dice assembly is also able to achieve a desirable targeted temperature on the bond pads of the top-most die while reducing natural convection heat loss. The heat transfer apparatus of the preferred embodiment is able to isolate the top-most die from environmental heat loss through consistently project an envelope of hot gas, thereby forcing the temperature gradient between the stacked dice assembly and the ambient atmosphere to stay relatively constant.

The invention described herein is susceptible to variations, modifications and/or addition other than those specifically described and it is to be understood that the invention includes all such variations, modifications and/or additions which fall within the spirit and scope of the above description.

The invention claimed is:

1. A wire bonding method for a first die that is stacked above a second die attached to a substrate, wherein the first die has bond pads, the method comprising the steps of:
    positioning a gas outlet adjacent to the first die;
    projecting a hot gas through and out of the gas outlet, the hot gas being simultaneously directed onto a plurality of the bond pads of the first die during the wire bonding, the hot gas being at a temperature sufficient for bringing the bond pads to a bonding temperature;
    controlling the projecting of the hot gas so as to create an envelope of the hot gas over the plurality of bond pads where wire bonding is conducted; and
    bonding wire onto the plurality of bond pads within the envelope of the hot gas.

2. The method as claimed in claim 1, wherein the hot gas has a temperature that is the same as or higher than the bonding temperature.

3. The method as claimed in claim 1, wherein the hot gas comprises an inert gas.

4. The method as claimed in claim 1, further comprising the step of synchronizing the positioning of the gas outlet with an operational movement positioning of a wire bonding apparatus to conduct the wire bonding.

5. The method as claimed in claim 1, wherein the projecting of the hot gas onto the first die is at an angle of 45° to 90° with respect to a plane of the first die.

6. The method as claimed in claim 1, wherein the projecting of the hot gas is at a flow rate of less than 56 m/s.

7. The method as claimed in claim 1, wherein the projecting of the hot gas is at a flow rate of between 5 m/s and 10 m/s.

8. The method as claimed in claim 1, further comprising before positioning the gas outlet, stacking the first die above the second die.

9. The method of claim 1, wherein the hot gas is projected through the gas outlet in a hot gas stream to the plurality of bond pads to create and maintain the envelope of hot gas over the plurality of bond pads.

10. The method of claim 1, wherein the hot gas at the bond pads is at a temperature sufficient for bringing the bond pads to a bonding temperature and below 300° C.

11. A method for conducting wire bonding on a first die that is stacked above a second die attached onto a substrate, the method comprising the steps of:
    positioning a gas outlet adjacent to the first die to project a hot gas through and out of the gas outlet simultaneously onto a plurality of bond pads of the first die, the hot gas being at a temperature sufficient for bringing the plurality of bond pads to a bonding temperature;
    attaching wires to the plurality of bond pads of the first die with a wire bonding tool when the plurality of bond pads reach and are at the bonding temperature; and
    controlling the projecting of the hot gas so as to create an envelope of the hot gas over the plurality of bond pads while wire bonding is conducted thereon.

12. The method as claimed in claim 11, further comprising before positioning the gas outlet, stacking the first die above the second die.

13. The method of claim 11, wherein the hot gas at the bond pads is at a temperature sufficient for bringing the bond pads to a bonding temperature and below 300° C.

14. A wire bonding method for a first die that is stacked above a second die attached to a substrate, the method comprising the steps of:
    positioning a gas outlet adjacent to the first die;
    projecting a hot gas through and out of the gas outlet, the hot gas being simultaneously directed onto a plurality of bond pads of the first die during the wire bonding, the hot gas being at a temperature sufficient for bringing the bond pads to a bonding temperature;
    synchronizing the positioning of the gas outlet with a movement of a wire bonding apparatus conducting the wire bonding; and
    directing the hot gas onto the plurality of bond pads while bonding wires thereto.

15. The method as claimed in claim 14, further comprising before positioning the gas outlet, stacking the first die above the second die.

16. The method of claim 14, wherein the hot gas at the bond pads is at a temperature sufficient for bringing the bond pads to a bonding temperature and below 300° C.

* * * * *